US006495413B2

United States Patent
Sun et al.

(10) Patent No.: US 6,495,413 B2
(45) Date of Patent: Dec. 17, 2002

(54) STRUCTURE FOR MASKING INTEGRATED CAPACITORS OF PARTICULAR UTILITY FOR FERROELECTRIC MEMORY INTEGRATED CIRCUITS

(75) Inventors: Shan Sun, Colorado Springs, CO (US); George Hickert, Colorado Springs, CO (US); Diana Johnson, Colorado Springs, CO (US); John Ortega, Colorado Springs, CO (US); Eric Dale, Colorado Springs, CO (US); Masahisa Ueda, Suyama Susono (JP)

(73) Assignees: Ramtron International Corporation, Colorado Springs, CO (US); Ulvac Japan, Ltd., Shizuoka (JP)

(*) Notice: Subject to any disclaimer, the term of this patent is extended or adjusted under 35 U.S.C. 154(b) by 0 days.

(21) Appl. No.: 09/797,394

(22) Filed: Feb. 28, 2001

(65) Prior Publication Data

US 2002/0117701 A1 Aug. 29, 2002

(51) Int. Cl.$^7$ .......................................... H01L 21/8242
(52) U.S. Cl. ........................ 438/240; 438/3; 438/253; 438/239; 438/381; 438/396; 257/296; 257/303; 257/306; 257/310
(58) Field of Search .......................... 438/3, 240, 253, 438/396, 239, 381; 257/296, 303, 306, 310

(56) References Cited

U.S. PATENT DOCUMENTS

| 5,254,217 A | 10/1993 | Maniar et al. ............... 156/656 |
| 5,868,951 A | 2/1999 | Schuck, III et al. ........... 216/24 |
| 5,936,306 A | 8/1999 | Jeng ............................ 257/751 |
| 5,998,258 A | 12/1999 | Melnick et al. ............... 438/253 |
| 6,037,211 A | 3/2000 | Jeng et al. .................... 438/253 |
| 6,080,499 A | 6/2000 | Eastep et al. ................. 428/701 |
| 2001/0034106 A1 * | 10/2001 | Moise et al. ................. 438/396 |

OTHER PUBLICATIONS

"Common and Unique Aspects of Perovskite Thin Film CVD Processes", P.C. Vanbuskirk, et al., © 1998, vol. 21, pp. 273–289.
"Microstructure of epitaxial SrRuO$_3$ thin films on (001) SrTiO$_3$", J. C. Jiang, et al., Revised Oct. 8, 1997; Accepted Dec. 23, 1997, http://msewww.engin.umich.edu:81/people/panx/publications/APL SRO 98A/909 1.html, Dec. 6, 2000.
"Novel Magnetism in SrRuO$_3$", S.E. Nagler and B.C. Chakoumakos, http://msewww.engin.umich.edu:81/people/panx/publications/APL SRO 98A/909 1.html, Dec. 6, 2000.
"Novel Magnetism in SrRuO$_3$", S.E. Nagler and B.C. Chakoumakos, http://neutrons.ornl.gov/NSatHFIR/RecentResearch/SEN/SrRu03.HTMLI, Dec. 6, 2000.
"Magnetoresistance Properties of Thin films of the Metallic Oxide Ferromagnet SrRuO$_3$", Steve C. Gausepohl, et al. (Phys. Rev. B52, 3459(1995)), http://erwin.phys.virginia.edu/research/group/lee/abstracts/surruo1.html, Dec. 6, 2000.

* cited by examiner

Primary Examiner—Wael Fahmy
Assistant Examiner—Hsien Ming Lee
(74) Attorney, Agent, or Firm—William J. Kubida, Esq.; Hogan & Hartson LLP

(57) ABSTRACT

A method for fabricating integrated capacitors, of particular utility in forming a ferroelectric capacitor array for a ferroelectric memory integrated circuits, begins with provision of a substrate. The substrate is typically a partially-processed CMOS integrated circuit wafer coated with an adhesion layer. Upon the substrate is deposited a bottom electrode layer, typically of noble metal, a dielectric layer, typically doped PZT, and a top electrode layer, typically a noble metal oxide. Next is deposited a hardmask layer of strontium ruthenium oxide, followed by a photoresist layer. The photoresist layer is aligned, exposed, developed, and cured as known in the art of integrated circuit photolithography. The resulting stack is then dry etched to remove undesired portions of the hardmask layer, the top electrode layer, and the dielectric layer. A principle advantage of the process is that a single photomasking operation is sufficient to define the top electrode and dielectric layers.

11 Claims, 2 Drawing Sheets

STRUCTURE FOR MASKING INTEGRATED CAPACITORS OF PARTICULAR UTILITY FOR FERROELECTRIC MEMORY INTEGRATED CIRCUITS

FIELD OF THE INVENTION

The invention relates to the field of fabricating integrated capacitors. In particular it relates to structure of, and methods for fabrication of, integrated capacitors as used in ferroelectric memory integrated circuits. The invention relates in particular to deposition, masking, and etching, of the dielectric and electrode layers of ferroelectric capacitors in ferroelectric memory integrated circuits.

BACKGROUND OF THE INVENTION

Standard Dynamic Random Access Memory (DRAM) and Static Random Access Memory (SRAM) devices are considered volatile memory devices because data stored therein is lost when power is lost. Nonvolatile memory devices are those that can retain data despite loss of power.

At present, there is a strong market for EEPROM (Electrically Erasable, Programmable Read Only Memory), and Flash EEPROM nonvolatile memory devices. These devices tend to be slow to write, often having write times on the order of milliseconds, while read times range generally between one nanosecond and one microsecond. The great difference between read and write times, together with the block-erase character of Flash EEPROM, complicates design of some systems. CMOS SRAM or DRAM with battery backup power for data retention can provide symmetrical, fast, read and write times in nonvolatile memory but is expensive, requires presence of a battery, and limits system life or requires eventual battery replacement.

It is known that Ferroelectric Random Access Memory (FRAM) is a nonvolatile memory technology having potential for both read and write times below one microsecond. FRAM nonvolatile memory devices based on Lead Zirconium Titanate (PZT) ferroelectric storage capacitors as memory elements integrated with CMOS addressing, selection, and control logic are known in the art and are commercially available. PLZT is a Lanthanum-doped form of PZT wherein some of the lead is replaced with Lanthanum, for purposes of this patent the term PZT includes PLZT. It is known that PZT may additionally be doped with strontium and calcium to improve its ferroelectric dielectric properties. Ferroelectric storage capacitors having a strontium bismuth tantalate (SBT) dielectric are also known in the art. For purposes of this patent the term Ferroelectric Dielectric includes both PZT and SBT materials.

It is expected that FRAM devices having smaller device geometries and smaller ferroelectric storage capacitors than currently available devices will offer greater speed and storage density at lower cost. Producing such FRAM devices requires production of well-defined, uniform, high quality, ferroelectric storage capacitors integrated with CMOS addressing and control logic.

Ferroelectric storage capacitors of FRAM devices have a bottom electrode interfacing with a ferroelectric layer, often PZT or SBT, that serves as the ferroelectric dielectric. The ferroelectric layer is typically deposited on top of the bottom electrode, and a top electrode is deposited on top of the ferroelectric layer. These layers are masked and etched to define the size and location of each capacitor. A passivation layer is formed over the resulting capacitors. This layer is masked and etched to allow connection of each capacitor to other components of each memory cell and to other components, such as CMOS addressing, selection, and control logic of the integrated circuit.

A prior process for fabricating an array of ferroelectric storage capacitors is described in U.S. Pat. No. 6,090,443, (the '443 patent) entitled "Multi-Layer approach for optimizing Ferroelectric Film Performance" and assigned to Ramtron International Corporation, Colorado Springs, Colo., the disclosure of which is incorporated herein by reference. This process involves the following steps all performed after deposition of an adhesion layer onto a substrate, the substrate may be a partially processed CMOS integrated circuit wafer:

Deposition of a metallic bottom electrode layer.

Deposition of a PZT layer.

Annealing the deposited PZT.

Depositing a top electrode layer.

Once these layers are deposited, they must be patterned to form an array through at least one masking and etching sequence. Each masking and etching sequence requires deposition of a photoresist over the array of partially processed capacitors, aligning the array with a photomask, exposing, developing, and curing the photoresist, and etching to remove undesired portions of the layers. The etching is controlled by remaining cured photoresist. Etching is typically performed with dry etch techniques, such as plasma etching or ion milling.

It is known that typical dry etch techniques as commonly used in processing capacitor arrays cause damage to the cured photoresist used to control etching. This damage may result in undercutting at edges of resist opening. As cured photoresist layers are eaten away, this damage may also result in undesired etching of those portions of the layers that should remain to form the array.

Typically, fabricating such a capacitor array is performed through a sequence of two or more masking and etching sequences because excessive damage to the photoresist occurs before the undesired portions of the layers are adequately removed. It is known, however, that repeated masking and etching sequences are expensive and can result in undesirable edge profiles of remaining portions as a result of misalignment. The undesirable edge profiles may necessitate greater spacing between capacitor array elements than may be otherwise possible. In particular, it is repeated photomasking operations that drive up cost.

It is also known that exposure of photoresist to dry etch causes release of an assortment of chemical compounds that contain carbon and hydrogen. It is also known that excessive exposure of ferroelectric dielectrics, such as PZT, to these compounds, including hydrogen, can induce undesirable properties in the dielectrics. For this patent, induction of undesirable properties by these compounds is known as photoresist byproduct poisoning of the dielectric. It is therefore desirable to protect the dielectric layer from these chemical compounds during the etching process.

A hardmask is a layer of resistant material that is patterned with photolithographic techniques as known in the art and used to control circuit processing. The resistant material is a material that is more stable than cured photoresist under at least some conditions, these conditions may include etching, diffusing, or oxidizing conditions. Hardmask layers are occasionally used in the processing of integrated circuits; although they are typically formed of nonconductive material. For example, standard CMOS processing uses a nonconductive silicon nitride hardmask layer to protect future diffused areas during field oxidation. U.S. Pat. No. 5,936, 306 describes a process utilizing a titanium silicide layer as a conductive hard mask for controlling wet etch of titanium nitride. U.S. Pat. No. 5,998,258 discloses a process for forming capacitors having a barium strontium titanate dielectric wherein a hardmask layer of titanium or tantalum nitride is used to pattern a top electrode. U.S. Pat. No. 5,998,258 also suggests, in column 4, using a hardmask layer in fabrication of capacitors having PZT ferroelectric dielectric and metallic top electrode.

Strontium ruthenium oxide, $SrRuO_3$ (SRO) is known to be a conductive metal oxide that has interesting magnetic properties. J. C. Jiang, X. Q. Pan and C. L. Chen discuss deposition of SRO films by laser ablation in an article entitled: "Microstructure of Epitaxial $SrRuO_3$ Thin Films on (001) $SrTi_O{}^3$".

SUMMARY OF THE INVENTION

This process involves the following steps all performed after deposition of an adhesion layer onto a substrate, the substrate may be a partially processed CMOS integrated circuit wafer:

Deposition of a metallic bottom electrode layer.
Deposition of a PZT dielectric layer.
Annealing the deposited dielectric.
Depositing a top electrode layer.
Depositing a strontium ruthenium oxide (SRO) hardmask layer over the top electrode layer.
Depositing, exposing, developing, and curing a photoresist layer over the SRO layer.
Dry etching of the SRO and top electrode layers, while destroying the photoresist layer.
Dry etching of the dielectric as defined by openings etched in the SRO and top electrode layers.
Depositing of a passivation and/or encapsulation layer.

Once these steps are performed, processing of the ferroelectric memory integrated circuit and its capacitor array continues as known in the art. Further processing includes: masking and etching of undesired bottom electrode portions, masking and etching of vias in the passivation layer to allow contact to electrodes of the capacitors array, as well as deposition, masking, and etching of circuit metalization and insulator layers.

The great advantage of the process is that depositing, masking, exposing, and curing of only one photoresist layer is required to define areas of the top electrode and ferroelectric dielectric layers.

A secondary advantage of the present process is that photoresist byproduct poisoning of the dielectric is prevented because the photoresist layer is removed before the PZT dielectric is exposed to etching plasma.

Since the process of the present invention can result in removal of the photoresist layer before the dielectric is exposed, less photoresist byproduct poisoning occurs than with standard processing. Further, it becomes possible to define the top electrode and ferroelectric dielectric layers of the capacitor array with a single masking and etching sequence, thereby reducing costs.

The foregoing and other features, utilities and advantages of the invention will be apparent from the following more particular description of a preferred embodiment of the invention as illustrated in the accompanying drawings.

DETAILED DESCRIPTION

Initial processing of a Ferroelectric RAM integrated circuit is as known in the art of CMOS integrated circuit processing. Silicon wafers are processed as known through formation of wells and source/drain diffused regions with deposition and masking of gates and deposition of a dielectric oxide over the gates. These wafers become substrates for formation of ferroelectric capacitor arrays. After the ferroelectric capacitor arrays are formed, wafers are completed as known in the art of CMOS integrated circuit processing, through masking and etching of contact and via holes, deposition, masking, and etching of conductor layers, and deposition of intermetal dielectric and protective passivation layers.

Figure 1:
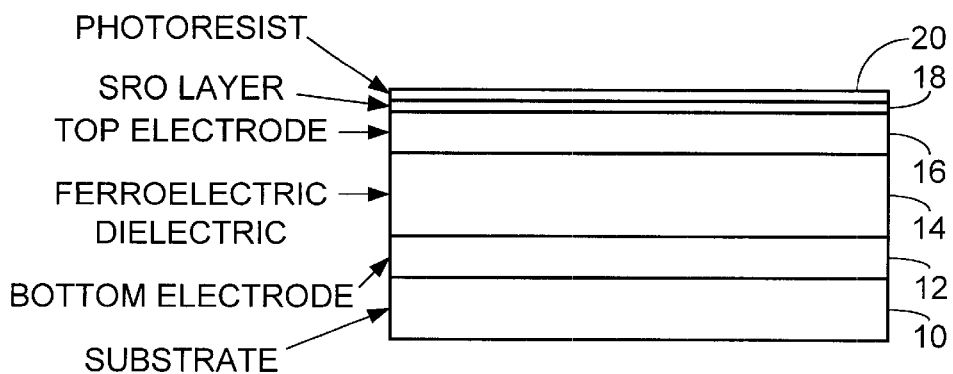
FIG. 1 is a cross section of an integrated capacitor after deposition of the bottom electrode, dielectric, top electrode, SRO hardmask, and photoresist layers.
Figure 2:
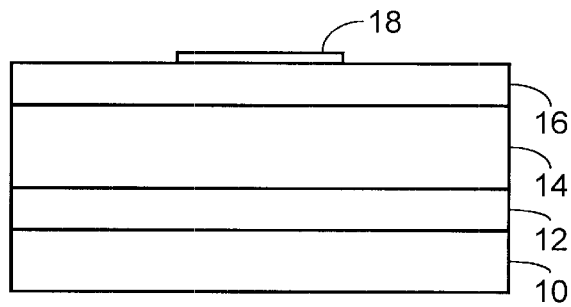
FIG. 2 is a flowchart of a representative process of the present invention.

With reference to FIGS. 1 and 2, formation of the ferroelectric capacitor arrays begins with deposition of an adhesion layer onto a substrate 10 (FIG. 1) comprising a partially-processed CMOS integrated circuit wafer. The ferroelectric capacitors are typically grown on top of a silicon oxide or a chemical vapor deposition ("CVD") layer of the wafer. On this oxide layer is sputtered a layer (not shown) of Titanium from fifty to two hundred, preferably two hundred, angstroms thick. This titanium layer is oxidized at from 300 to 700 degrees C., with 700 degrees C. preferred, for from ten minutes to one hour in oxygen atmosphere to form an adhesion layer (not shown) of titanium dioxide that enhances adhesion, and thereby prevent delamination, of following layers. In those processes where platinum (Pt) is utilized, proper orientation of the bottom electrode should be maintained.

On the oxidized titanium adhesion layer of the substrate 10 is deposited 202 a conductive bottom electrode layer 12 from five hundred to two thousand five hundred angstroms thick, with about one thousand angstroms thickness preferred for optimum electrode quality. For optimum electrode quality, and optimum quality of following PZT layers, this layer comprises a noble metal, platinum preferred, and is deposited by DC sputtering with a substrate temperature of 450 to 600 degrees C. For purposes of this application, a noble metal is platinum, iridium, palladium, or another metal largely comprised of an element located in the same region of the periodic table as platinum, iridium, and palladium. Alternatively, some success has been achieved with bottom electrodes fabricated of a conductive noble metal oxide, such as iridium oxide or $La_{0.5}Sr_{0.5}CoO_3$ ("LSCO"). It is necessary that the melting point of the bottom electrode be sufficiently high that it will not melt during following high temperature processing steps, such as anneal steps performed at temperatures of five hundred to eight hundred degrees Celsius.

Next, one or more layers of lanthanum-doped PZT ferroelectric dielectric 14 is deposited 204. This may be a single layer 14 of thickness about one thousand eight hundred angstroms of PZT, preferably modified with calcium and strontium dopants to obtain desirable electrical properties. Alternatively, a lead-rich, lanthanum doped, PZT ferroelectric thin film of thickness about one hundred fifty angstroms may be sputtered, preferably lanthanum doped and modified with calcium and strontium dopants. If used, this lead-rich layer is then topped with a further sputtered 206 bulk PZT layer (not shown) approximately one thousand six hundred fifty angstroms thick, giving a total PZT thickness of about one thousand eight hundred angstroms. PZT deposition is preferably done by RF sputtering on substrate having a temperature approximately twenty-five degrees C. PZT deposition may also be done by the sol-gel method as described on pages 400–401 of the Extended Abstracts of the 1999 International Conference on Solid State Devices and Materials, Tokyo, 1999 or by an MOCVD method described in: "Common and Unique Aspects of Perovskite Thin Film CVD Processes" published in Integrated Ferroelectrics, in 1998 at Vol. 21, pages 273–289.

The PZT is next annealed 206 by rapid thermal annealing (rAT). This anneal is conducted in a low vacuum, or largely insert gas atmosphere, thereby having less oxygen than ambient air. It is desirable that the atmospheric used for anneal contain an oxygen partial pressure no more than ten percent of one atmosphere. A mixture of approximately 5% $O_2$ in argon at atmospheric pressure has been used. This step is referenced herein as a first anneal, or a crystallization anneal.

For purposes of this application, the term noble gas is helium, argon, neon, or any other gases having similar properties and similarly situated in the periodic table. The term inert gas comprises any gas that does not significantly chemically react with the surface of an integrated circuit under conditions of the process step in which it is used, and includes noble gas. The term low vacuum includes conditions of gas mixtures comprising inert gas, air, and/or oxygen at total pressure significantly less than one atmosphere.

The partially annealed PZT is next capped by deposition 208 of a sputtered amorphous iridium oxide (IrOx) conductive top electrode layer 18 of thickness from one thousand to two thousand angstroms, with a preferred thickness of one thousand five hundred angstroms. This electrode is deposited by DC sputtering on a substrate at room temperature. For purposes of this application, a noble metal oxide is an oxide of a noble metal as heretofore defined, including platinum and iridium oxides. While other conductive materials including noble metals and noble metal oxides may serve as a top electrode, iridium oxide has been found particularly effective as a top electrode layer.

After the top electrode layer 18 is deposited 208, a further conductive hardmask layer 20 of strontium ruthenium oxide ($SrRuO_3$)(SRO) approximately seven hundred fifty angstroms thick is deposited 210, preferably also by DC sputtering.

Once the SRO layer is deposited, a layer of photoresist 20 is deposited 212. The photoresist is preferably about seven thousand angstroms thick, and is exposed to mercury-vapor I-line through a suitable mask using a reduction as known in the art of integrated circuit manufacture, developed, and cured 214 in the manner known in the art.

Figure 3:
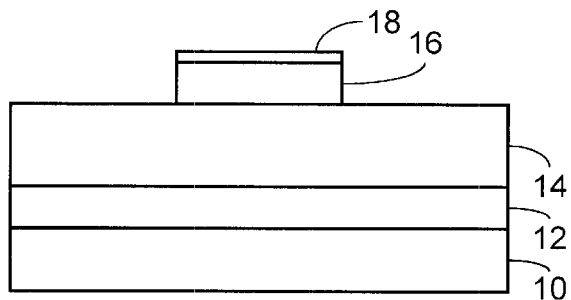
FIG. 3, a cross section of the integrated capacitor of FIG. 1, after further steps of exposing, developing, and curing the photoresist, followed by dry etching to remove selected portions of the SRO hardmask and thin or remove the photoresist.

After the photoresist is cured, the stack is placed in a plasma etching machine. The dry etching machine is fed with a gas mixture comprising four parts of Argon with one part of chlorine at one-half Pascal pressure for SRO 18 and top electrode 16 etch. This mixture is excited to etch 216 undesired portions of the SRO layer as indicated in FIG. 3. During this phase of etching, the photoresist layer 20 is significantly thinned or removed.

Figure 4:
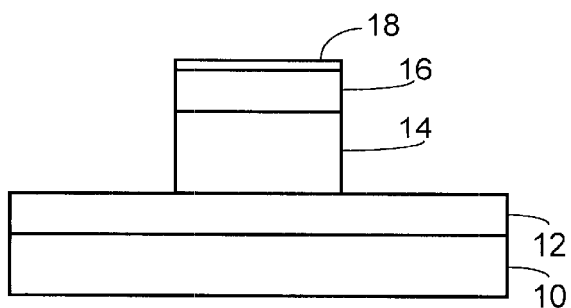
FIG. 4, a cross section of the integrated capacitor of FIG. 2, after further dry etching to remove selected portions of the top electrode layer and any remaining photoresist.
Figure 5:
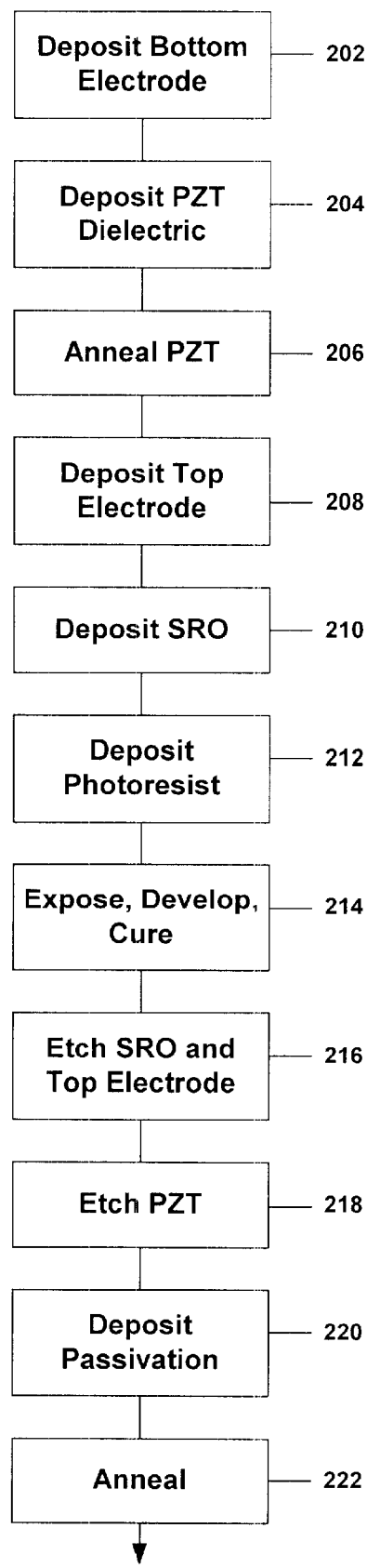
FIG. 5, a flow chart of certain steps associated with the method of the present invention.

Etching under these conditions is continued to completely remove the photoresist layer 20 and remove undesired portions of the top electrode 16 as illustrated in FIG. 4.

Once the top electrode 16 is etched, the gas mixture fed to the plasma etching machine is changed to two parts argon with one part chlorine at three tenths Pascal pressure; this mixture is excited as known in the art of dry etching to remove undesired portions of the PZT layer 14. This second etching phase is a PZT etch 218.

Next a passivation and/or encapsulation layer 22 of PZT or aluminum oxide is deposited 220 over the capacitor structure, and the resulting capacitor structure is again annealed by rapid thermal annealing 222.

Processing continues as known in the art to mask and etch the bottom electrode layer, and mask and etch contact holes in the encapsulation layer. Processing is also continued to deposit, mask, and etch the interconnect dielectric, passivation and metalization layers typical of CMOS integrated circuits to interconnect the resulting ferroelectric capacitors and other components of the circuit to produce a Ferroelectric RAM integrated circuit.

Although a specific process comprising steps 202 through 222 has been disclosed and described in detail, it should be recognized that a MOCVD PZT process may also be utilized to effectuate the present invention instead.

It is known that SRO etches more slowly in the dry etch conditions used than does IrOx and PZT. The thickness of SRO preferably utilized varies the thickness of the top electrode and PZT layers, although it is generally in the range of from five hundred to one thousand angstroms thick for top electrode thicknesses as herein disclosed. This thickness is chosen such that the photoresist layer is completely removed before the first etching step cuts through the top electrode, such that the PZT layer is protected from direct exposure to the gasses evolved as the photoresist is attacked by the etching process. As a result, photoresist byproduct poisoning of the dielectric is prevented.

While the invention has been particularly shown and described with reference to a preferred embodiment thereof, it will be understood by those skilled in the art that various other changes in the form and details may be made without departing from the spirit and scope of the invention.

What is claimed is:

1. A method for fabricating integrated capacitors comprising the steps of:

providing a substrate;

depositing a bottom electrode layer on the substrate;

depositing a dielectric layer on the bottom electrode layer;

depositing a top electrode layer on the dielectric layer;

depositing a conductive hardmask layer on the top electrode layer;

depositing a photoresist layer on the hardmask layer;

exposing, developing, and curing the photoresist layer; and etching to remove undesired portions of the hardmask layer, the top electrode layer, and the dielectric layer, wherein the conductive hardmask layer comprises strontium ruthenium oxide.

2. The method of claim 1, wherein a single step of exposing a photoresist layer is used to define the top electrode layer and dielectric layer.

3. The method of claim 2, wherein the dielectric layer is a ferroelectric dielectric layer comprising a doped lead-zirconium-titanate material.

4. The method of claim 3, wherein the top electrode layer comprises a noble metal oxide.

5. The method of claim 4, wherein the hardmask layer comprises strontium ruthenium oxide.

6. The method of claim 5, wherein the step of etching comprises a dry etching using a gas mixture comprising an inert gas and chlorine.

7. The method of claim 6, wherein the step of etching comprises a first dry etching using a gas mixture comprising about four parts of argon to one part of chlorine.

8. The method of claim 7, wherein the step of etching comprises a second dry etching using a gas mixture comprising about two parts of argon to one part of chlorine.

9. The method of claim 1, wherein the dielectric layer is a ferroelectric dielectric layer comprising a doped lead-zirconium-titanate material.

10. The method of claim 9, wherein the top electrode layer comprises a conductive noble metal oxide.

11. The method of claim 5, wherein the top electrode layer comprises iridium oxide, the dielectric layer comprises lead-zirconium-titanate material doped with lantanum, strontium, and calcium, and the method further comprises at least one step of annealing.

* * * * *